United States Patent
Delfyett et al.

(10) Patent No.: US 6,690,686 B2
(45) Date of Patent: Feb. 10, 2004

(54) METHOD FOR REDUCING AMPLITUDE NOISE IN MULTI-WAVELENGTH MODELOCKED SEMICONDUCTOR LASERS

(75) Inventors: Peter J. Delfyett, Geneva, FL (US); Michael M. Mielke, Orlando, FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 10/378,213

(22) Filed: Mar. 3, 2003

(65) Prior Publication Data

US 2003/0165164 A1 Sep. 4, 2003

Related U.S. Application Data (60) Continuation-in-part of application No. 10/132,820, filed on Apr. 25, 2002, and a continuation-in-part of application No. 09/904,680, filed on Jul. 13, 2001, and a continuation-in-part of application No. 09/829,759, filed on Apr. 10, 2001, which is a division of application No. 09/344,422, filed on Jun. 25, 1999, now Pat. No. 6,314,115, which is a division of application No. 09/096,271, filed on Jun. 11, 1998, now Pat. No. 6,256,328.

(60) Provisional application No. 60/369,764, filed on Apr. 3, 2002, provisional application No. 60/329,989, filed on Oct. 17, 2001, and provisional application No. 60/085,566, filed on May 15, 1998.

(51) Int. Cl.[7] ............................................. H01S 3/98
(52) U.S. Cl. ............................ 372/18; 372/20; 372/23
(58) Field of Search ........................... 372/18, 20, 23; 359/163, 180, 124

(56) References Cited

U.S. PATENT DOCUMENTS

| | | | |
|---|---|---|---|
| 6,018,536 A | 1/2000 | Alphonse | 372/23 |
| 6,061,369 A | 5/2000 | Conradi | 372/6 |
| 6,064,681 A | 5/2000 | Ackerman | 372/32 |
| 6,192,058 B1 | 2/2001 | Abeles | 372/6 |
| 6,256,328 B1 | 7/2001 | Delfyett et al. | 372/23 |
| 6,275,317 B1 * | 8/2001 | Doerr et al. | 398/201 |
| 6,275,511 B1 | 8/2001 | Pan et al. | 372/6 |

OTHER PUBLICATIONS

Shi, et al. "Four–wavelength, 10–GHZ picosecond pulse generation from an active modelocked single–stripe diode laser", OSA Tech. digest Series, vol. 11, (CLEO), 1997.

(List continued on next page.)

*Primary Examiner*—Paul IP
*Assistant Examiner*—Cornelius H. Jackson
(74) *Attorney, Agent, or Firm*—Brian S. Steinberger; Law Offices of Brian S. Steinberger, P.A.

(57) ABSTRACT

Multiwavelength modelocked laser systems and methods for reducing intensity fluctuations and amplitude noise in each of the wavelength channels as well as manipulating the interwavelength phase coherence properties. The systems and methods can include lens, semiconductor optical amplifier, grating, cylindrical lens, rod lens and an approximately 7 nm MQW saturable absorber between mirrors for providing a laser cavity resonator for hybridly modelocked operation. Additional systems and methods can include two different positions for the saturable absorber inside the laser resonator which enables direction of the interwavelength phase coherence properties. Up to approximately 300 MHz optical pulse trains in each of up to approximately three channels can be generated. Combining gain flattening and noise suppression within the optical cavity of the modelocked laser can result in generating up to approximately 123 wavelength channels, each having up to approximately 6 Giga Hertz optical pulse trains.

18 Claims, 9 Drawing Sheets

LEGEND
CL: cylindrical lens
L: spherical lens
M: mirror
RL: rod lens
SA: saturable absorber
SF: spatial filter
SOA: semiconductor optical amplifier

OTHER PUBLICATIONS

Mielke, et al. "60 channel WDM transmitter using multiwavelength modelocked semiconductor laser", Electron. Lett., v 38 n 8 Apr. 11, 2002 pp. 368–370.

Kudo, et al. "Multiwavelength microarray semiconductor lasers", Electron. Lett, v 34 n 21 Oct. 15, 1998, pp. 2037–2038.

Morioka, et al. "Multi–WDM–channel, Gbit/s pulse generation from a single laser source utilizing LD–pumped supercontinuum in optical fibers", IEEE Photonics Tech. Lett., v 6 n 3 Mar. 1994, pp. 365–368.

Coudenys, et al. "Multiwavelength InGaAs/InGaAsP strained–layer MQW–laser array using shadow–masked growth", IEEE Photonics Tech. Lett., v 4 n 6 Jun. 1992, pp. 524–526.

Zhu,, et al. "Multiwavelength picosecond optical pulse generation using an actively modelocked multichannel grating cavity laser", Journal of Lightwave Tech., v 13 n 12 Dec. 1995, pp. 2327–2335.

Papakyriakopoulos, et al. "10×10 GHz simultaneously modelocked multiwavelength fibre ring laser", Electron. Lett. v 35 n 9 Apr. 29, 1999, pp. 717–718.

Chow, et al. "Multiwavelength generation in an erbium–doped fiber laser using in–fiber comb filters", IEEE Photonics Tech. Lett., v 8 n 1 Jan. 1996, pp. 60. 62.

* cited by examiner

Fig. 1

LEGEND
CL: cylindrical lens
L: spherical lens
M: mirror
RL: rod lens
SA: saturable absorber
SF: spatial filter
SOA: semiconductor optical amplifier

Fig. 2

Rod Lens (RL)

LEGEND
L: spherical lens
M: mirror
SA: saturable absorber
SF: spatial filter
SOA: semiconductor optical amplifier

METHOD FOR REDUCING AMPLITUDE NOISE IN MULTI-WAVELENGTH MODELOCKED SEMICONDUCTOR LASERS

This invention claims the benefit of U.S. Provisional Application 60/369,764 filed Apr. 3, 2002, and this invention is a Continuation-In-Part of U.S. application Ser. No. 10/132,820 filed Apr. 25, 2002, which claims the benefit of priority to U.S. Provisional Application 60/329,989 filed on Oct. 17, 2001, and this invention is a Continuation-In-Part of U.S. application Ser. No. 09/904,680 filed Jul. 13, 2001, which is a divisional application of U.S. application Ser. No. 09/344,422 filed Jun. 25, 1999 now U.S. Pat. No. 6,314,115, and the invention is a Continuation-In-Part of U.S. application Ser. No. 09/829,759 filed Apr. 10, 2001, which is a divisional application of U.S. application Ser. No. 09/096,271 filed Jun. 11, 1998 now U.S. Pat. No. 6,256,328, which claims the benefit of priority to U.S. provisional application 60/085,566 filed May 15, 1998, and this invention was funded in part under Natural Science Foundation NSF Grant ECS 9629066 and NSF Grant ECS 0071941, and this invention relates to lasers, and in particular to a method and apparatus for generating a multiplicity of wavelengths from a single semiconductor laser chip that reduces undesirable intensity fluctuations on individual wavelength channels.

BACKGROUND AND PRIOR ART

Multiwavelength generation lasers have been increasingly demonstrated over the past several years. For example, the subject invention assignee as been at the forefront of developing multiwavelength modelocked semiconductor diode lasers. See for example, Shi et al. "Four-wavelength, 10-GHZ picosecond pulse generation from an active modelocked single-stripe diode laser," Conference proceeding presentation on May 18–23, 1997, OSA Technical Technical Digest Series Vol. 11, Conference on Lasers and Electro-optics (CLEO), 1997; and Mielke et al. "60 channel WDM transmitter using multiwavelength modelocked semiconductor laser," Electron. Lett., v 38 n 8 Apr. 11, 2002. P. 368–370. Wavelength division multiplexing (WDM) in telecommunication and data transmission systems increases system capacity by more fully taking advantage of the intrinsic bandwidth of installed optical fiber. Channel widths and spacings have been standardized so those necessary system components such as lasers and spectrally dispersive components can be designed for interoperability. Simultaneously, the data rate of individual channels is being pushed toward higher rates with approximately 10 Gbit standards (both Sonet and Ethernet) near deployment. Current architectures utilize a separate laser for each wavelength channel introducing complexity and cost issues. Significant research has been conducted to develop and assess potential multiwavelength sources for WDM systems. Multiple active device arrays of both laser diodes and vertical cavity surface emitting lasers (VCSELs) have been constructed and tested but problems with growth control toward exact spectral emission remain a concern. See Kudo, K., Furushima, Y., Nakazaki, T., Yamaguchi, M., "Multiwavelength microarray semiconductor lasers", Electron. Lett., v 34 n 21 Oct. 15, 1998. P. 2037–2038. Continuum generation in optical fibers from high power pulsed sources followed by spectral filtering has been demonstrated but suffers from the need for the high power front end as well as the power inefficiency of discarding much of the generated spectrum in the filtering process. See Morioka, T., Mori, K., Kawanishi, S., Saruwatari, M., "Multi-WDM-channel, Gbit/s pulse generation from a single laser source utilizing LD-pumped super continuum in optical fibers", IEEE Photonics Tech. Lett., v 6 n 3 March 1994. P. 365–368.

Multiple-quantum-well devices with individually shifted spectral gain have also been constructed and utilized downstream spectral filtering with the attendant power inefficiencies. See Coudenys, G., Moerman, I., Zhu, Y., Van Daele, P., Demeester, P., "Multiwavelength InGaAs/InGaAsP strained-layer MQW-laser array using shadow-masked growth", IEEE Photonics Tech. Lett., v 4 n 6 June 1992, p 524–526. Cavities based on various grating technologies, Zhu, B., White, I., "Multiwavelength picosecond optical pulse generation using an actively modelocked multichannel grating cavity laser", Journal of Lightwave Tech., v 13 n 12 December 1995, p 2327–2335, and erbium fiber ring cavities with distributed fiber gratings or etalons have also been demonstrated. See Papakyriakopoulos, T., Stavdas, A., Protonotarios, E., Avramopoulos, H., "10×10 GHz simultaneously modelocked multiwavelength fibre ring laser", Electron. Lett., v 35 n 9 Apr. 29, 1999 p 717–718 and Chow, J., Town, G., Eggleton, B., Ibsen, M., Sugden, K., Bennion, I., "Multiwavelength generation in an erbium-doped fiber laser using in-fiber comb filters", IEEE Photonics Tech. Lett., v 8 n 1 January 1996, p 60–62.

A common problem with current multiwavelength generation systems is that the individual channels often generate pulses having different amplitude (intensity) values. A further problem with current multiwavelength generation systems is the lack of control over the interwavelength phase coherence properties.

In addition to the subject assignee's contributions, over the years various attempts have been made for generating multiwavelength lasers. See for example, U.S. patents: U.S. Pat. No. 6,018,536 to Alphonse; U.S. Pat. No. 6,061,369 to Conradi; U.S. Pat. No. 6,064,681 to Ackerman; U.S. Pat. No. 6,192,058 to Abeles; U.S. Pat. No. 6,275,511 to Pan et al. However, none of the known prior art overcomes the problems of consistently and actively preventing uneven amplitude values for each of the multiwavelength channels nor does it offer flexibility and command of the phase coherence properties of the emitted light.

SUMMARY OF THE INVENTION

A primary objective of the subject invention is to provide a multiwavelength laser method and system that reduces undesirable intensity fluctuations on individual wavelength channels.

A secondary objective of the subject invention is to provide a multiwavelength laser method and system that provides an "error-free" pulse train simultaneously into each of its discrete wavelength channels.

A third objective of the subject invention is to provide a multiwavelength laser method and system that reduces amplitude noise in multiwavelength modelocked semiconductor lasers.

A fourth objective of the subject invention is to provide a multiwavelength laser method and system with better longitudinal mode phase coherence properties.

A fifth objective of the subject invention is to provide a multiwavelength laser method and system with specific tailored interwavelength phase coherence properties, including a high coherence operational mode as well as a low coherence operational mode.

A sixth objective of the subject invention is to provide a multiwavelength laser method and system that generates a large plurality of wavelength channels (up to and greater than 100 channels) by combining gain flattening and noise suppression.

Multiwavelength modelocked optical laser systems and methods. The preferred embodiments of the system and method can include lens, semiconductor optical amplifier, grating, cylindrical lens, rod lens and an approximately 7 nm MQW saturable absorber between mirrors for providing a laser cavity resonator for hybridly modelocked operation.

Two preferred embodiments illustrate two different positions for the saturable absorber inside the laser resonator which enables direction of the interwavelength phase coherence properties. The invention has been demonstrated to generate up to approximately 300 MHz optical pulse trains in each of up to approximately three channels.

An additional embodiment can include combining gain flattening and noise suppression within the optical cavity of the modelocked laser that can result in generating up to approximately 123 wavelength channels, each having up to approximately 6 Giga Hertz optical pulse trains.

Further objectives and advantages of this invention will be apparent from the following detailed description of presently preferred embodiments which are illustrated schematically in the accompanying drawings.

DESCRIPTION OF THE PREFERRED EMBODIMENTS

Before explaining the disclosed embodiments of the present invention in detail it is to be understood that the invention is not limited in its applications to the details of the particular arrangement shown since the invention is capable of other embodiments. Also, the terminology used herein is for the purpose of description and not of limitation.

The subject invention claims the benefit of U.S. Provisional Application 60/369,764 filed Apr. 3, 2002, and this invention is a Continuation-In-Part of U.S. application Ser. No. 10/132,820 filed Apr. 25, 2002, which claims the benefit of priority to U.S. Provisional Application 60/329,989 filed on Oct. 17, 2001, and this invention is a Continuation-In-Part of U.S. application Ser. No. 09/904,680 filed Jul. 13, 2001, which is a divisional application of U.S. application Ser. No. 09/344,422 filed Jun. 25, 1999 now U.S. Pat. No. 6,314,115, and the invention is a Continuation-In-Part of U.S. application Ser. No. 09/829,759 filed Apr. 10, 2001, which is a divisional application of U.S. application Ser. No. 09/096,271 filed Jun. 11, 1998 now U.S. Pat. No. 6,256,328, which claims the benefit of priority to U.S. provisional application 60/085,566 filed May 15, 1998, all of which are incorporated by reference.

The invention expands upon previous efforts utilizing external cavity oscillators based on SOAs (Semiconductor Optical Amplifiers) at both approximately 830 and approximately 1550 nm. See Shi, H., Finlay, J., Alphonse, G., Connolly, J., Delfyett, P., "Multiwavelength 10-GHz picosecond pulse generation from a single-stripe semiconductor diode laser", *IEEE Photonics Tech. Lett.*, v 9 n 11 November 1997, p 1439–1441; Nitta, I., Abeles, J., Delfyett, P., "Hybrid wavelength-division and optical time-division multiplexed multiwavelength mode-locked semiconductor laser", *Applied Optics-LP*, v 39 n 36 December 2000, p 6799–6805; and Park, E., Abeles, J., Braun, A., Delfyett, P., "Multiwavelength generation at 1.55 micron from an external cavity semiconductor laser", *Proceeding of SPIE*, v 4042, 2000, SPIE, Bellingham, Wash., USA, p 82–87.

Figure 1:
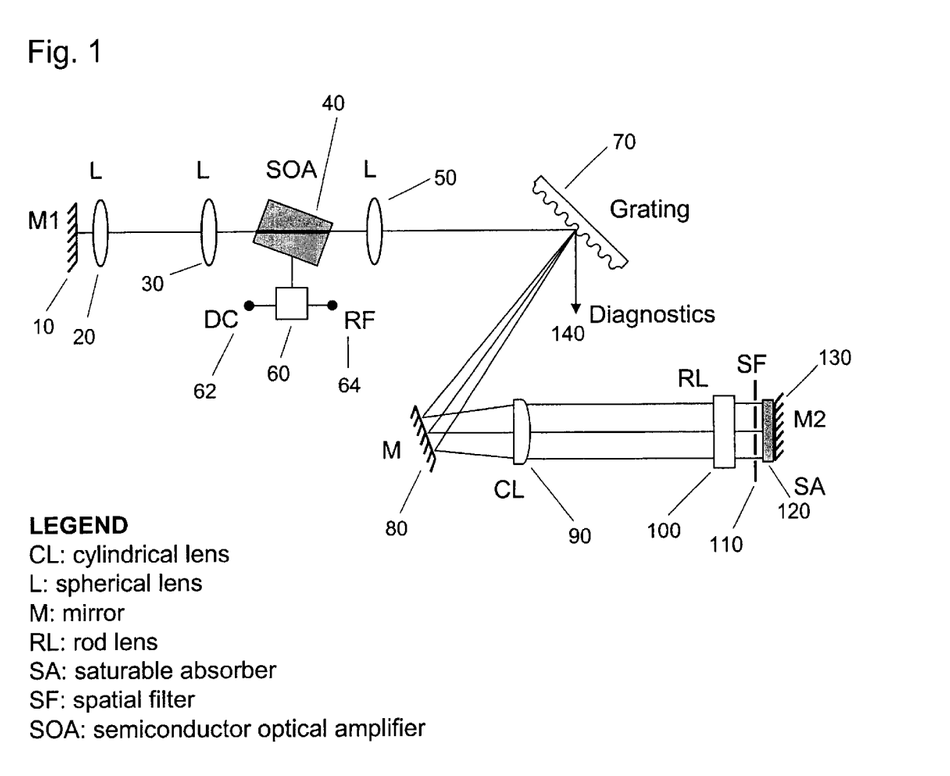
FIG. 1 is a schematic set-up of a preferred layout of a multiwavelength hybridly modelocked semiconductor diode laser for low interwavelength phase coherence operation.
Figure 2:
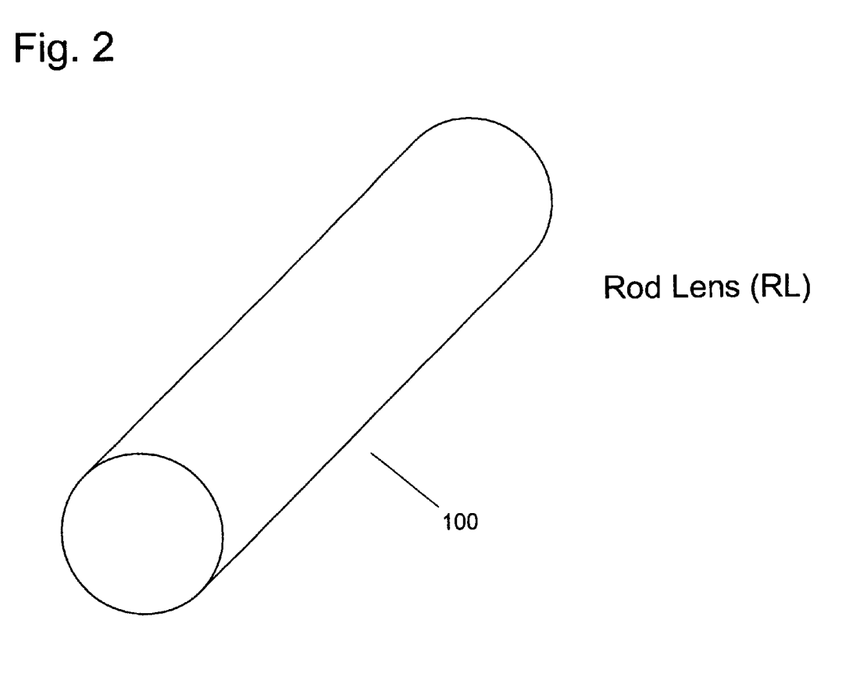
FIG. 2 is an enlarged view of an RL (rod lens) used in FIG. 1.

FIG. 1 is a schematic set-up of a first preferred embodiment of a multiwavelength hybridly modelocked semiconductor diode laser 1. FIG. 2 is an enlarged view of the rod lens (RL) 100 used in FIG. 1. Referring to FIGS. 1–2, M1 and M2 refers to mirrors 10 and 130 respectively, such as simple high reflectors for active modelocked operation. Mirror M2 can be combined with an approximately 7 nm multiple-quantum-well saturable absorber for hybridly modelocked operation. Lens 20, 30 and 50 can each be an approximate 8 mm focal length lens for collimating or focusing the light there through. SOA 40 can be a semiconductor optical amplifier such as but not limited to GaAs (gallium arsenide), AlGaAs (aluminum gallium arsenide), and the like. Bias-tee 60 can include a DC bias 62 of approximately 175 mA and RF sinusoidal signal 64 having a frequency of approximately 300 MHz. Grating 70 can be approximately 1800 lines per mm. Component 80 can be a broadband reflective mirror. 90 refers to a cylindrical lens such as a CVI Laser Corporation part number RCX-40.0-25.4-63.6-C-633-1064 (available off-the-shelf) 125 mm focal length, plano-convex lens. RL 100 can be a rod lens such as an Edmund Industrial Optics part number L45-943 (available off-the-shelf) high numerical aperture, cylindrical lens. Spatial filter 110 can be a spatial transmission mask with variable intensity transmission, variable phase delay (or optical path length) or a combination of both amplitude and phase variation. SA 120 refers to a saturable absorber such as approximately 7 nm multiple-quantum-well saturable absorber. Diagnostics 140 can be a spectrometer and a photodiode that are used to measure the optical spectrum as well as the laser temporal character.

Referring to FIGS. 1–2, mirror M1 10 reflects light back toward the laser cavity gain element and, along with mirror M2 130, defines a laser cavity resonator there between. Lens 20 can focus the collimated laser light onto mirror M1 10, significantly improving the laser cavity resonator stability. Lens 30 can collect and collimate the light emitted by the semiconductor optical amplifier (SOA) 40 which provides broadband intracavity gain necessary for laser modelocking. Lens 50 collects and collimates the light emitted by the SOA 40. Bias-tee 60 combines the direct current input 62 and the radio frequency sinusoidal signal input 64 and delivers them to the SOA 40. Direct current input 62 establishes population inversion, thereby enabling optical gain, in the SOA 40. Radio frequency input 64 modulates the amplitude of the current injected into the SOA 40 and, along with saturable absorber 120, establishes hybrid modelocking. Grating 70 can provide angular dispersion in the optical spectrum. Mirror 80 relays the laser light into a different direction and is a mechanical convenience. Cylindrical lens 90 collimates the laser light from grating 70 converting angular dispersion to linear dispersion. Rod lens (RL) 100 tightly focuses the laser light in the vertical plane providing a sufficiently high irradiance at the saturable absorber 120 to activate the material nonlinear response. Spatial filter 110 filters the laser beam in order to define the multiwavelength optical spectrum. Saturable absorber 120 provides a nonlinear response to the optical intensity and, along with the RF signal 64, establishes hybrid modelocking. Mirror M2 130 reflects light back toward the laser cavity gain element and, along with Mirror M1 10, defines the laser cavity resonator.

Figure 3:
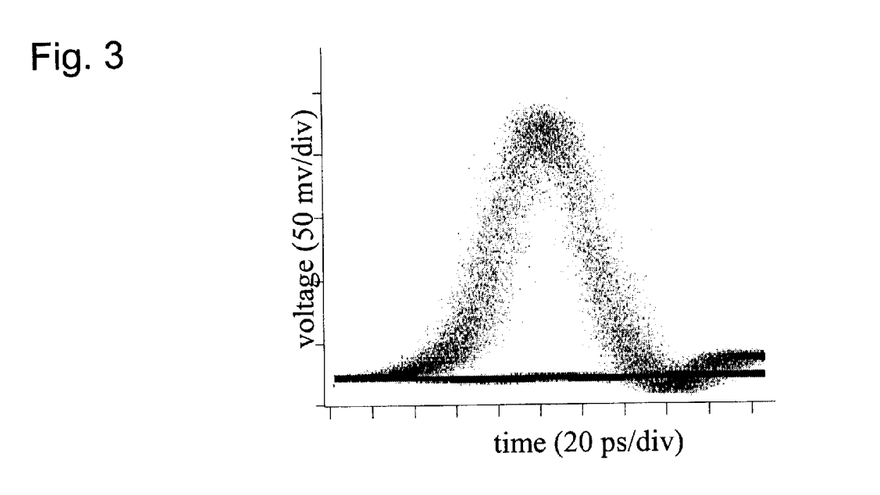
FIG. 3 shows an eye diagram of a three wavelength composite pulse under actively modelocked operation which, along with FIG. 4, demonstrates a deficiency of previous multiwavelength generation systems.
Figure 4:
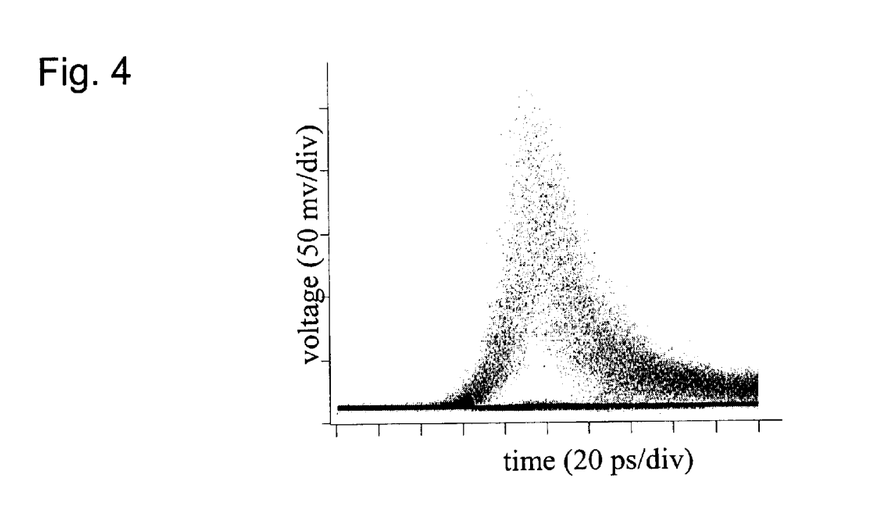
FIG. 4 shows an eye diagram of a single channel pulse under actively modelocked operation, which, along with FIG. 3, demonstrates a deficiency of previous multiwavelength generation systems

FIGS. 3 and 4 show eye diagrams of a composite three-wavelength pulse and a single-wavelength-channel pulse, respectively, for the case of multiwavelength actively modelocking. Multiwavelength active modelocking is part of the known prior art related to this invention and is highlighted here to illustrate the benefit of the present invention. The three-wavelength eye diagram is characterized by a small standard deviation in the vertical point spread function that describes the pulse-to-pulse amplitude variations. The measured Q and bit-error rate (BER) that correspond to the three-wavelength eye diagram are 7.774 and $3.83 \times 10^{-15}$, respectively. See, for example, G. Agrawal, *Fiber Optic Communication Systems* [Wiley, N. Y., 1997], which is nonessential subject matter incorporated by reference.

We approximated the bit-error rate (BER) information based on the eye-diagrams of the detected optical signals shown in FIGS. 3, 4, 8A–8C, and 12A–12C. The vertical point spread in the voltage waveform is approximated as a Gaussian distribution for both the 1 pulse and the 0 pulse. The mean, $\bar{v}$, and standard deviation, $\sigma$, are measured electronically with a Tektronix CSA 803 Signal Analyzer. These measurements are taken at the center of the eye diagram, where the opening is the largest. From these we obtain the factor Q and the BER using equations 1 and 2 below.

$$Q = \frac{\bar{v}_1 - \bar{v}_0}{\sigma_1 + \sigma_0} \quad (1)$$

and $$BER = \frac{1}{2} \mathrm{erfc}\left(\frac{Q}{\sqrt{2}}\right) \quad (2)$$

where erfc is the complimentary error function.

The small standard deviation shows that the total pulse power from the laser remains relatively constant. In contrast, the single-wavelength eye diagram exhibits a large standard deviation which corresponds to a Q and BER of approximately 2.811 and approximately $2.47 \times 10^{-3}$, respectively. This statistical measure reveals the large pulse-to-pulse intensity fluctuations, or amplitude noise, that are present within the discrete wavelength channels of a multiwavelength actively modelocked laser. Together these eye diagrams qualitatively illustrate the effect known as mode partition noise.

Figure 5:
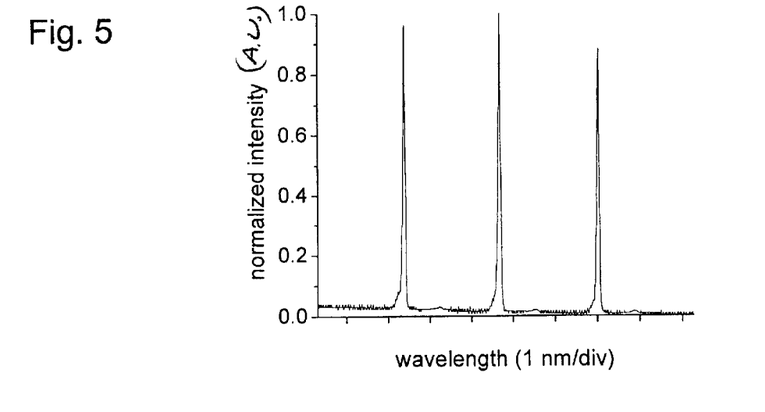
FIG. 5 shows a three-wavelength spectrum of normalized intensity versus wavelength that is produced by the laser sketched in FIG. 1.

FIG. 5 displays the optical spectrum emitted by the multiwavelength, hybridly modelocked laser of FIG. 1, revealing the simultaneous generation of three discrete wavelength channels by the single semiconductor laser. The approximately 0.5 dB difference in the magnitude of the three spectral peaks shows that the average powers of the three wavelength channels are substantially identical. The figure also illustrates the channel separation of approximately 2.3 nm (1 THz).

Figure 6:
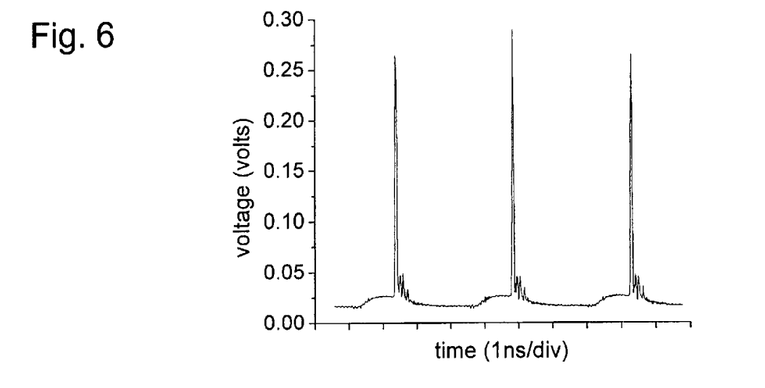
FIG. 6 shows a three-wavelength pulse train of voltage versus time that is produced by the laser sketched in FIG. 1.

FIG. 6 shows the temporal character of the multiwavelength, hybridly modelocked laser of FIG. 1. The laser emits a precisely-timed sequence of short optical pulses at a rate of approximately 300 MHz which exactly matches the laser cavity fundamental pulse-repetition frequency. These short optical pulses are characteristic of laser modelocking, and the lack of satellite pulses illustrates substantial synchronization between wavelength channels.

Figure 7:
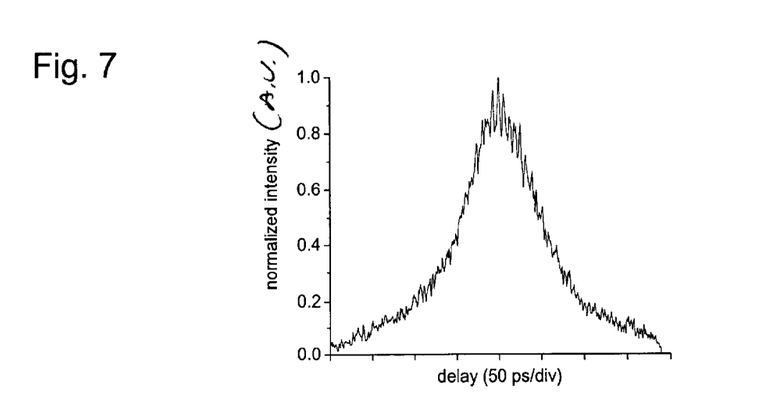
FIG. 7 shows a three-wavelength intensity autocorrelation of normalized intensity versus temporal delay that is produced by the laser sketched in FIG. 1.

FIG. 7 illustrates through an intensity autocorrelation trace the low interwavelength phase coherence nature of the hybridly modelocked, multiwavelength laser operating with the configuration shown in FIG. 1. Multiwavelength modelocked laser pulse autocorrelations are known to exhibit beat fringes when the wavelengths have appreciable phase coherence. See Shi et al., "Demonstration of phase correlation in multiwavelength mode-locked semiconductor diode lasers," *Optics Lett.* v 24 n 4 Feb. 15, 1999. P. 238–240, which is nonessential subject matter incorporated by reference. The intensity autocorrelation trace shown in FIG. 7 has minimal fringe contrast which indicates minimal phase coherence between the laser wavelengths. Since the individual wavelengths are spatially separated (dispersed) by the grating when incident upon the saturable absorber 120 inside the laser cavity (FIG. 1), the nonlinear optical material response provides a high degree of longitudinal mode coherence within the linewidth of each wavelength channel. This configuration does not enable interwavelength coordination, however, and the overall modelocking dynamics favor a low interwavelength phase coherence mode of laser operation.

Figure 8A:
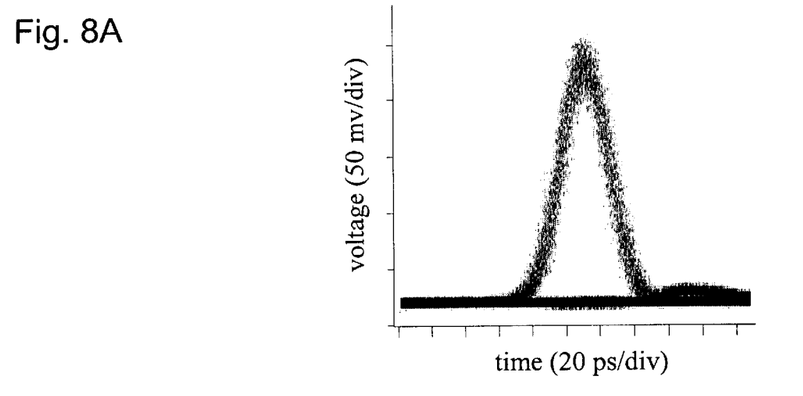
FIG. 8A shows an eye diagram of the channel-one pulse that is produced by the laser sketched in FIG. 1.
Figure 8B:
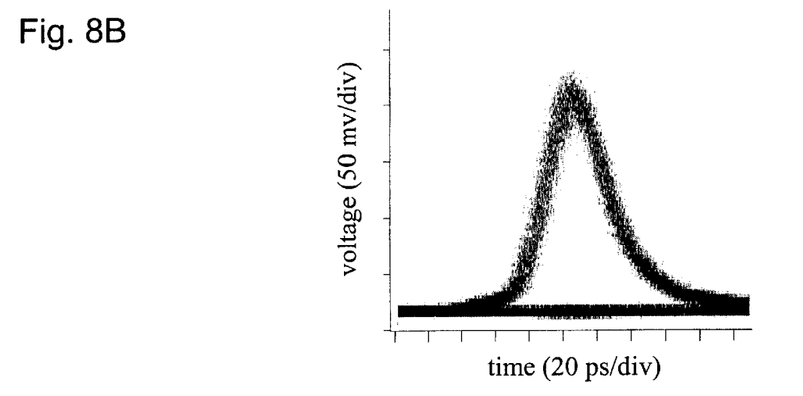
FIG. 8B shows an eye diagram of the channel-two pulse that is produced by the laser sketched in FIG. 1.
Figure 8C:
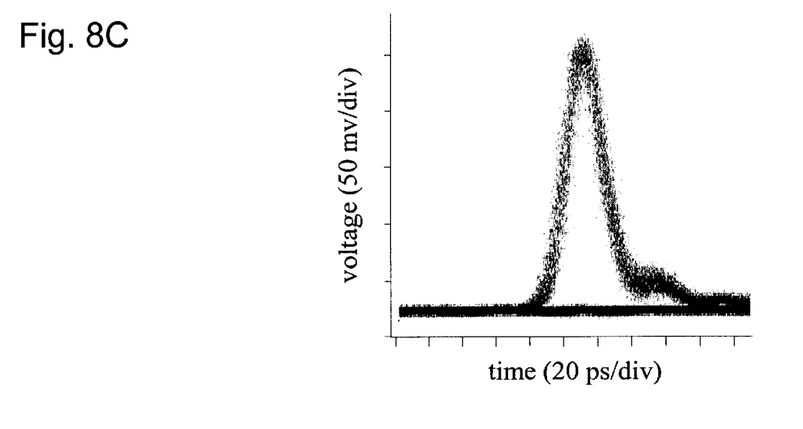
FIG. 8C shows an eye diagram of the channel-three pulse that is produced by the laser sketched in FIG. 1.

FIG. 8A shows the channel-one eye diagram under hybridly modelocked operation (FIG. 1 laser) and demonstrates, along with FIGS. 8B and 8C, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 13.15, hence the BER is negligible.

FIG. 8B shows the channel-two eye diagram under hybridly modelocked operation (FIG. 1 laser) and demonstrates, along with FIGS. 8A and 8C, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 18.14, hence the BER is negligible.

FIG. 8C shows the channel-three eye diagram under hybridly modelocked operation (FIG. 1 laser) and demonstrates, along with FIGS. 8A and 8B, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 15.99, hence the BER is negligible.

Figure 9:
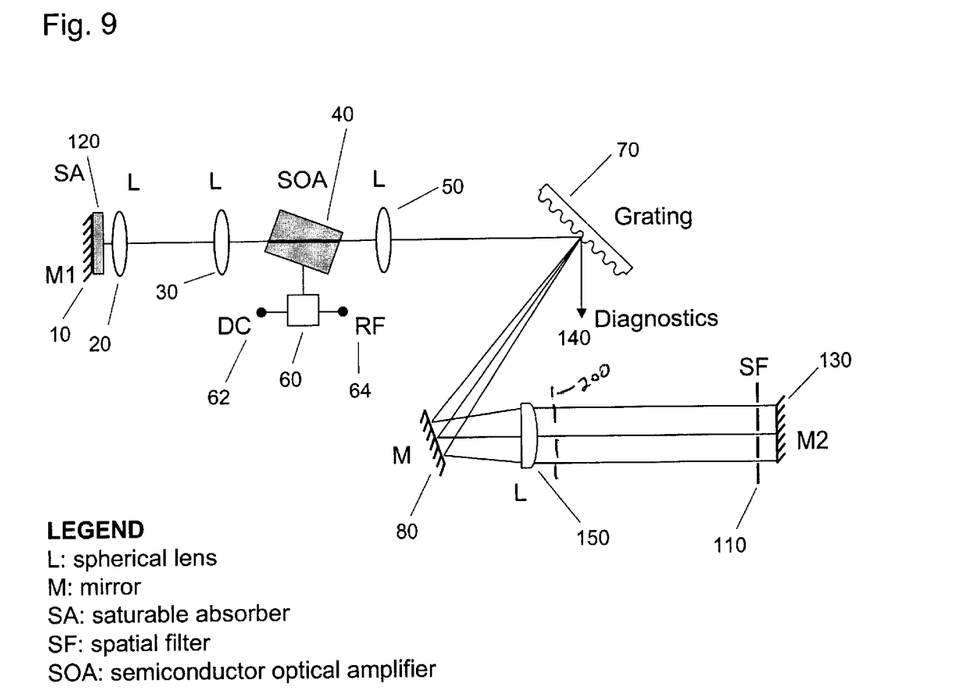
FIG. 9 is a schematic set-up of a preferred layout of a multiwavelength hybridly modelocked semiconductor diode laser for high interwavelength phase coherence operation.

FIG. 9 illustrates a second configuration of the multi-wavelength hybridly modelocked semiconductor diode laser cavity for producing highly phase coherent multiple wavelengths. The components of FIG. 9 are identical to those of FIG. 1 with the exception that the FIG. 9 configuration shifts the saturable absorber 120 to the opposite end of the laser cavity, adjacent to mirror 10, and the substitution of a 125 mm focal length spherical lens 150 for the cylindrical lens 90 and rod lens 100 pair. This lens substitution is not required, though it simplifies the laser cavity. The position of the saturable absorber 120 is shifted in this configuration so that the nonlinear material response is induced by the simultaneous superposition of the multiple wavelengths inside the laser cavity. This action tends to coordinate the temporal phases of the individual wavelengths with one another and results in the high degree of interwavelength phase coherence.

Figure 10:
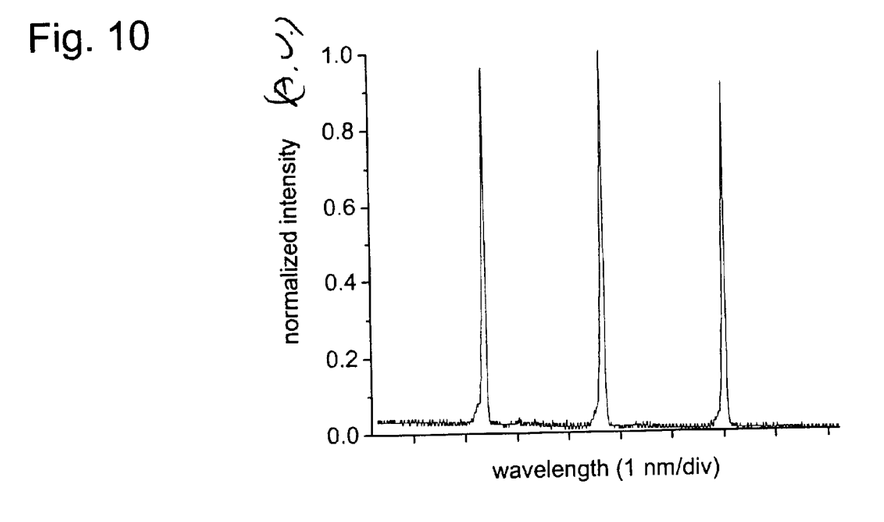
FIG. 10 shows a three-wavelength spectrum of normalized intensity versus wavelength that is produced by the laser sketched in FIG. 9.

FIG. 10 shows the optical spectrum emitted by the multiwavelength hybridly modelocked laser sketched in FIG. 9, revealing the simultaneous generation of three discrete wavelength channels by the single semiconductor laser. The less than 0.5 dB difference in the magnitude of the three spectral peaks shows that the average powers of the three wavelength channels are substantially identical. The figure also illustrates the channel separation of approximately 2.3 nm (1 THz).

Figure 11:
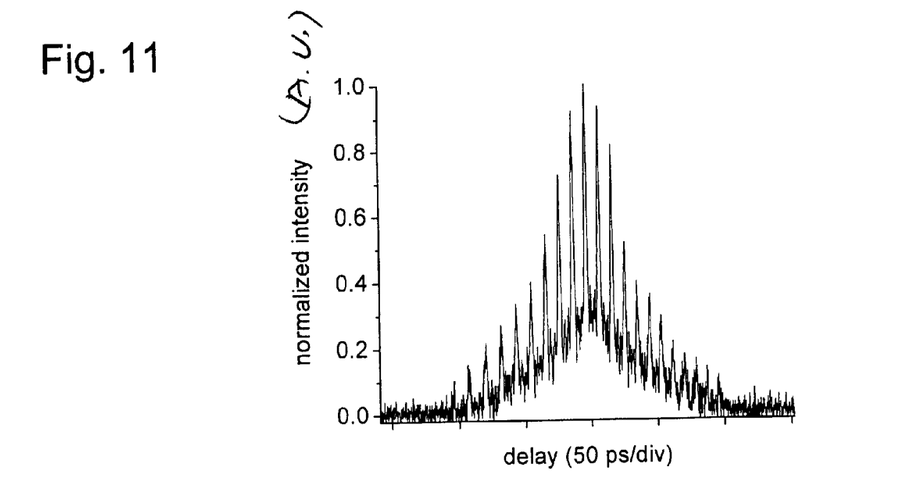
FIG. 11 shows a three-wavelength intensity autocorrelation of normalized intensity versus temporal delay that is produced by the laser sketched in FIG. 9.

FIG. 11 reveals the high interwavelength phase coherence nature of the hybridly modelocked, multiwavelength laser operating with the configuration shown in FIG. 9. The intensity autocorrelation trace shown in FIG. 11 has approximately 70% fringe contrast which indicates substantially enhanced phase coherence between the laser wavelengths. The fringes are caused by the coherent beating of the detuned wavelength laser pulses that exist parallel in time and colinear in space.

Figure 12A:
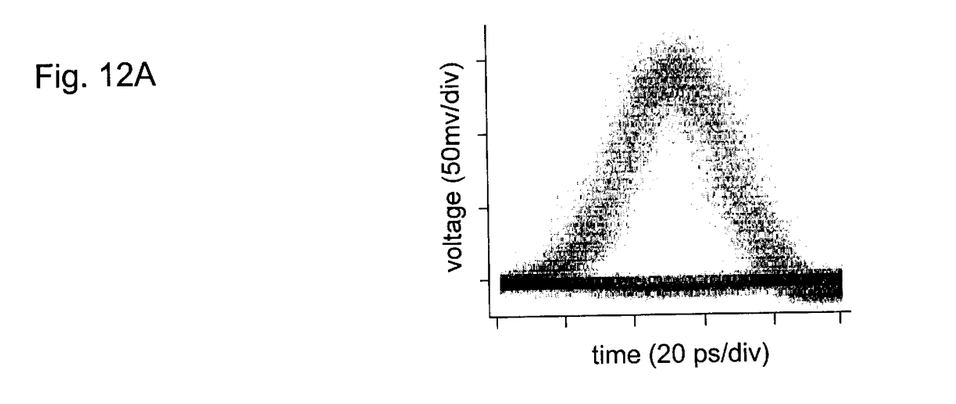
FIG. 12A shows an eye diagram of the channel-one pulse that is produced by the laser sketched in FIG. 9.
Figure 12B:
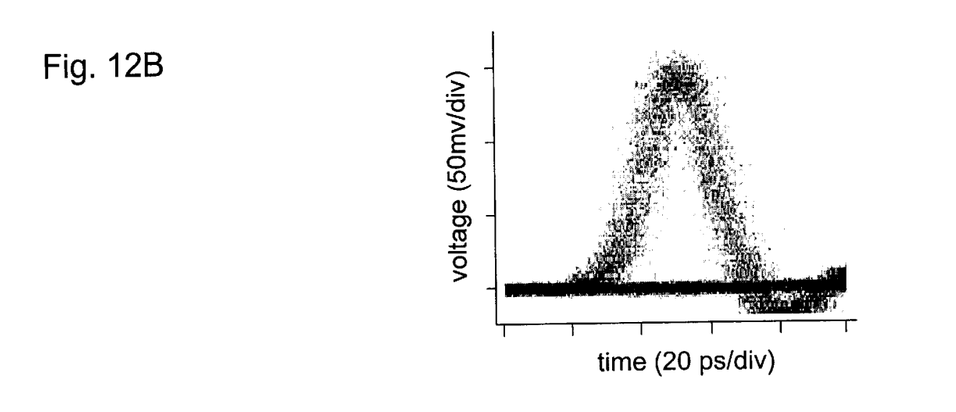
FIG. 12B shows an eye diagram of the channel-two pulse that is produced by the laser sketched in FIG. 9.
Figure 12C:
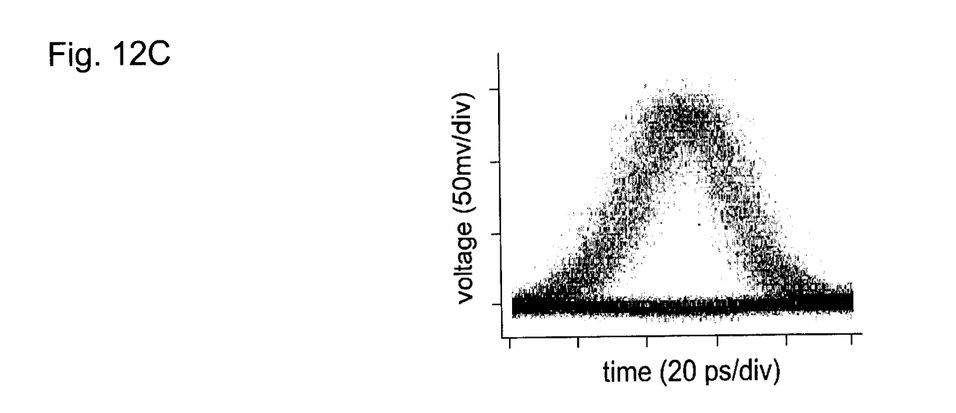
FIG. 12C shows an eye diagram of the channel-three pulse that is produced by the laser sketched in FIG. 9.

FIG. 12A shows the channel-one eye diagram under hybridly modelocked operation (FIG. 9 configuration) and demonstrates, along with FIGS. 12B and 12C, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 9.4, hence the BER is less than approximately $10^{-20}$.

FIG. 12B shows the channel-one eye diagram under hybridly modelocked operation (FIG. 9 configuration) and demonstrates, along with FIGS. 12A and 12C, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 10.2, hence the BER is less than approximately $10^{-20}$.

FIG. 12C shows the channel-one eye diagram under hybridly modelocked operation (FIG. 9 configuration) and demonstrates, along with FIGS. 12A and 12B, that the amplitude fluctuations, or mode partition noise, can be suppressed in all three wavelength channels simultaneously. There is no eye closure, or large standard deviation in the point spread function, as shown in FIG. 4. The Q associated with this eye diagram is approximately 9.3, hence the BER is less than approximately $10^{-20}$.

The invention described here can be extended to suppress mode partition noise and tailor the phase coherence properties in lasers emitting more than three wavelength channels. The number of channels is limited by the usable gain spectrum of the gain element (SOA, EDFA, and the like), the interchannel spacing, and the absorption spectrum of the saturable absorber. We demonstrate the technique using only three wavelengths in order to facilitate channel isolation (demultiplexing) for the diagnostic equipment.

Figure 13:
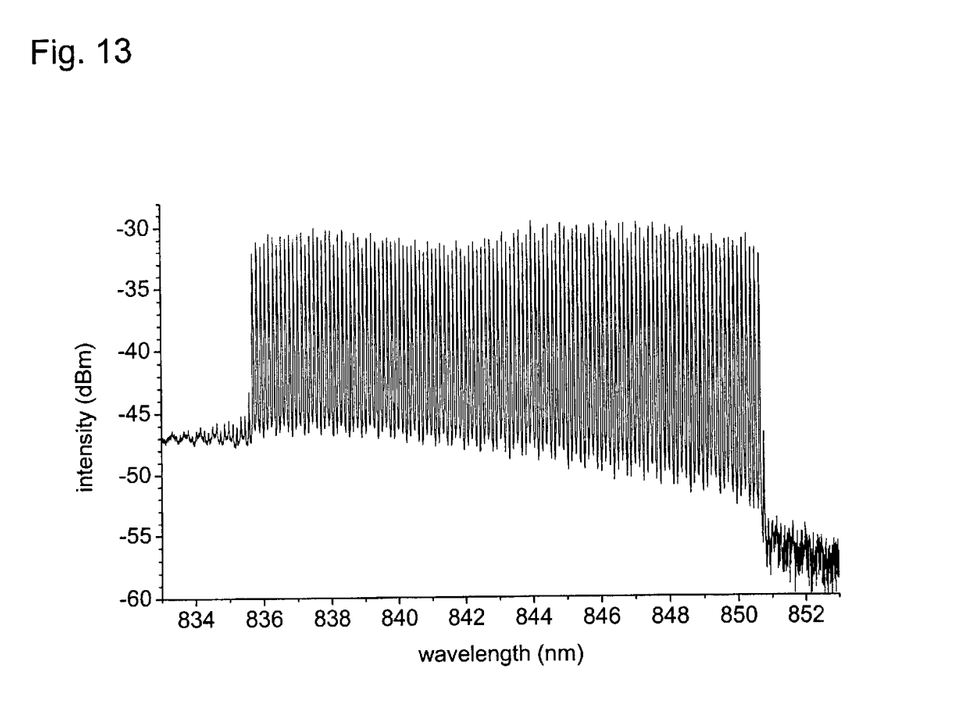
FIG. 13 shows a one hundred twenty three (123)-wavelength spectrum of normalized intensity versus wavelength.

FIG. 13 shows a 123-wavelength laser spectrum generated by the hybridly modelocked, multiwavelength laser configuration in FIG. 9 combined with a spatial filter 200, such as but not limited to a semicircular opaque material, and the like, which can block light inside the laser cavity formed between the mirrors M1 and M2, which forms intracavity gain flattening. The wavelength channel spacing is 50 GHz (0.12 nm) and the intensity variation in limited to 3 dB across the entire 15 nm wide laser spectrum. With this modified configuration of FIG. 9, each channel can generate approximately 6 Giga Hertz optical pulse trains. Though the lack of available equipment to demultiplex prevents characterization of wavelength channels separated by approximately 50 GHz near 830 nm, this figure demonstrates that multiwavelength hybrid modelocking can produce a large plurality of wavelength channels (approximately 123 channels) for cost-effective photonic telecommunication systems. Thus, the combination of gain flattening plus noise suppression can form up to 123 wavelength channels, each generating up to approximately 6 Giga Hertz per channel.

The invention can incorporate a laser diode based on any of these semiconductor types: GaN, GaAs, AlGaAs, AlAs, AlSb, AlP, InP, InAs, InGaAsP, InAlGaAs, InAlGaP, GaP, GaSb, InSb, BSb, BP, BN, BAs, CdTe, HgS, HgSe, HgTe, ZnS, ZnSe, ZnTe.

The invention can incorporate a laser gain element such as: Semiconductor optical amplifier (SOA), erbium doped fiber amplifier (EDFA), HeNe laser, Argon Ion laser, HeCd laser, Metal Vapor lasers, Carbon Dioxide laser, Excimer laser, Nitrogen laser, Dye lasers, Ruby laser, Nd:YAG, Nd:Glass, Alexandrite laser, Titanium Sapphire laser, Chromium LiSAF and LiCaF lasers, Raman lasers.

The invention has applications for commercial information networks, along with military and aerospace optical signal processing systems. Additionally, the invention can be used with high capacity telecommunication systems, fiber optic communication systems and I. T. networks. The low-coherence mode of operation reduces the probability of nonlinear optical interactions between communications channels in optical fiber transmission systems and other guided-wave devices which result in detrimental communications channel cross-talk.

The invention can have further applications for basic scientific research when a pulsed, multiwavelength laser source with reduced intensity fluctuations and/or managed phase coherence properties is necessary. The invention can moreover be used for testing of telecommunication network components that requires simultaneous low-noise and/or coherent illumination of multiple WDM channels. This application might comprise tests for coherent nonlinear optical interactions between WDM channels.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A multiwavelength hybridly modelocked laser system, comprising:

means for simultaneously generating multiple individual wavelength channels of laser light from a modelocked laser source within an optical cavity; and means for reducing intensity fluctuations and amplitude noise on the individual multiwavelength channels within the optical cavity the reducing means including at least one lens and a saturable absorber, the at least one lens to focus the laser light in a vertical plane providing sufficiently high radiance at the saturable absorber to activate a nonlinear response, wherein the optical cavity forms a hybrid modelocking laser.

2. The laser system of claim 1, wherein the generating means includes:

GaAs.

3. The laser system of claim 1, wherein the generating means includes:

AlGaAs.

4. The laser system of claim 1, wherein the generating means includes:

InP.

5. The laser system of claim 1, wherein the generating means includes:

InAlGaAs.

6. The laser system of claim 1, wherein the generating means includes:

InAlGaP.

7. The laser system of claim 1, wherein the generating means includes:

GaN.

8. The laser system of claim 1, wherein the saturable absorber includes:

a multiple-quantum well saturable absorber.

9. The laser system of claim 1, wherein the at least one lens includes:

a cylindrical lens and a rod lens.

10. The laser system of claim 1, wherein the channels include:

means for generating up to approximately 300 MHz optical pulse trains in each of up to approximately three channels.

11. The laser system of claim 1, wherein the channels include:

means for generating up to approximately 6 Giga Hertz optical pulse trains in each of up to approximately 123 channels.

12. The laser system of claim 1, further comprising:

a spatial filter means within the laser cavity for blocking light passing therethrough and to define a multiwavelength optical spectrum.

13. A method for reducing intensity fluctuations and amplitude noise in a multiwavelength laser device to cause a hybridly modelocked laser, comprising the steps of:

generating simultaneously multiple wavelength channels of laser Light from a modelocked laser source within an optical cavity; and reducing intensity fluctuations and amplitude noise in each of the channels, within the optical cavity by focusing the laser light in a vertical plane providing sufficiently high radiance at a saturable absorber to activate a nonlinear response therefrom so that the optical cavity forms a hybrid modelocking laser.

14. The method of claim 13, further comprising the step of:

providing an "error free" multiwavelength pulse train output.

15. The method of claim 13, wherein the step of generating includes:

generating up to approximately 300 MHz optical pulse trains in each of up to approximately three channels.

16. The method of claim 13, wherein the step of generating includes:

generating up to approximately 6 Giga Hertz optical pulse trains in each of up to approximately 123 channels.

17. The method of claim 13, wherein the phase reducing step further includes the step of:

adjusting interwavelength phase coherence by shifting the position of the saturable absorber within the optical cavity.

18. The method of claim 13, further including the step of providing a cylindrical lens and a rod (RL) lens for focusing the light into the saturable absorber.

* * * * *